(12) United States Patent
Cook et al.

(10) Patent No.: US 9,893,707 B2
(45) Date of Patent: Feb. 13, 2018

(54) CIRCUITS, DEVICES AND METHODS RELATED TO QUADRANT PHASE SHIFTERS

(71) Applicant: SKYWORKS SOLUTIONS, INC., Woburn, MA (US)

(72) Inventors: Mackenzie Brian Cook, Montreal (CA); John William Mitchell Rogers, Nepean (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/250,743

(22) Filed: Aug. 29, 2016

(65) Prior Publication Data
US 2017/0063342 A1    Mar. 2, 2017

Related U.S. Application Data

(60) Provisional application No. 62/211,778, filed on Aug. 29, 2015.

(51) Int. Cl.
*H03H 11/16* (2006.01)
*H03H 7/20* (2006.01)
(52) U.S. Cl.
CPC ..................... *H03H 7/20* (2013.01)
(58) Field of Classification Search
None
See application file for complete search history.

(56) References Cited

U.S. PATENT DOCUMENTS

| | | | | |
|---|---|---|---|---|
| 3,982,168 A * | 9/1976 | Bose | ..................... | H02M 5/271 327/254 |
| 4,638,190 A * | 1/1987 | Hwang | ................... | H01Q 3/385 327/237 |
| 8,427,217 B1 * | 4/2013 | Le Grand de Mercey | ................... | H03H 11/20 327/231 |
| 8,558,597 B2 * | 10/2013 | Agrawal | ................. | H04L 27/01 327/231 |
| 9,608,611 B1 * | 3/2017 | Hearne | ................... | H03K 5/135 |
| 2015/0070242 A1 * | 3/2015 | Kawai | ...................... | H03H 7/20 343/853 |
| 2016/0182003 A1 * | 6/2016 | Teshima | ................... | H03H 7/38 455/73 |

(Continued)

*Primary Examiner* — Lincoln Donovan
*Assistant Examiner* — Khareem E Almo
(74) *Attorney, Agent, or Firm* — Chang & Hale LLP

(57) ABSTRACT

Circuits, devices and methods are disclosed, including a phase shifter configured to provide a bypass state, a single first-handed quarter-wave state, a double first-handed quarter-wave state, or a single second-handed quarter-wave state utilizing two or less inductors. In some implementations, a phase shifter is disclosed to provide a first node and a second node, a first switchable path having a first inductance and a second inductance arranged in series between the first and second nodes, a capacitive grounding path implemented on each side of each of the first and second inductances, at least one of the capacitive grounding paths configured as a switchable capacitive grounding path, and a reconfiguring circuit assembly configured to allow the phase shifter to provide a plurality of quadrant phase shifts utilizing the first and second inductances and the at least one switchable capacitive grounding path.

20 Claims, 11 Drawing Sheets

(56) References Cited

U.S. PATENT DOCUMENTS

| 2017/0063324 A1* | 3/2017 | Cook | H03H 7/20 |
| 2017/0063342 A1* | 3/2017 | Cook | H03H 7/20 |
| 2017/0133999 A1* | 5/2017 | Ishizuka | H03H 7/18 |

* cited by examiner

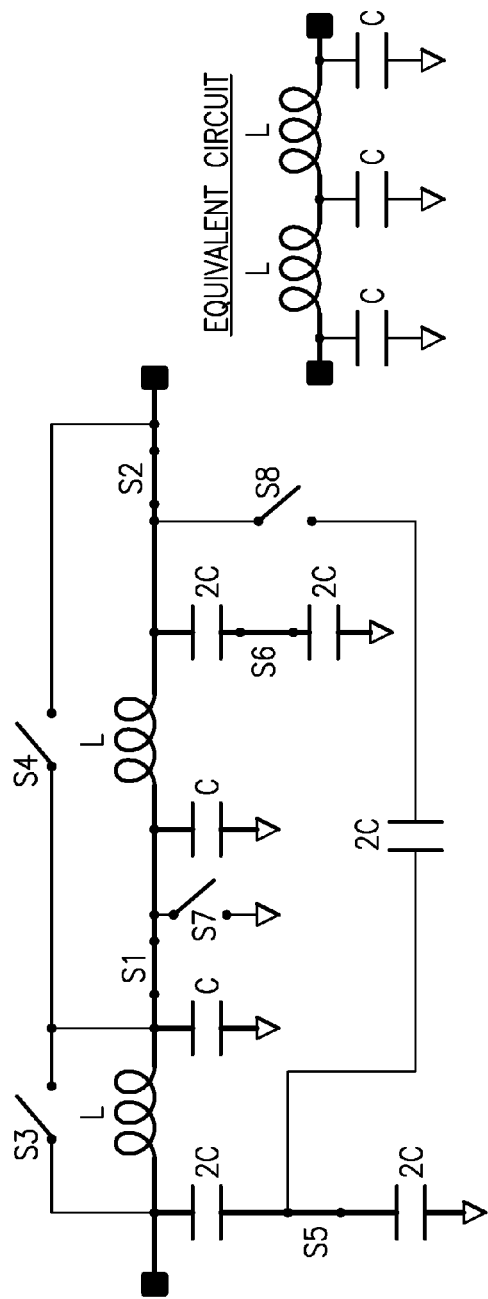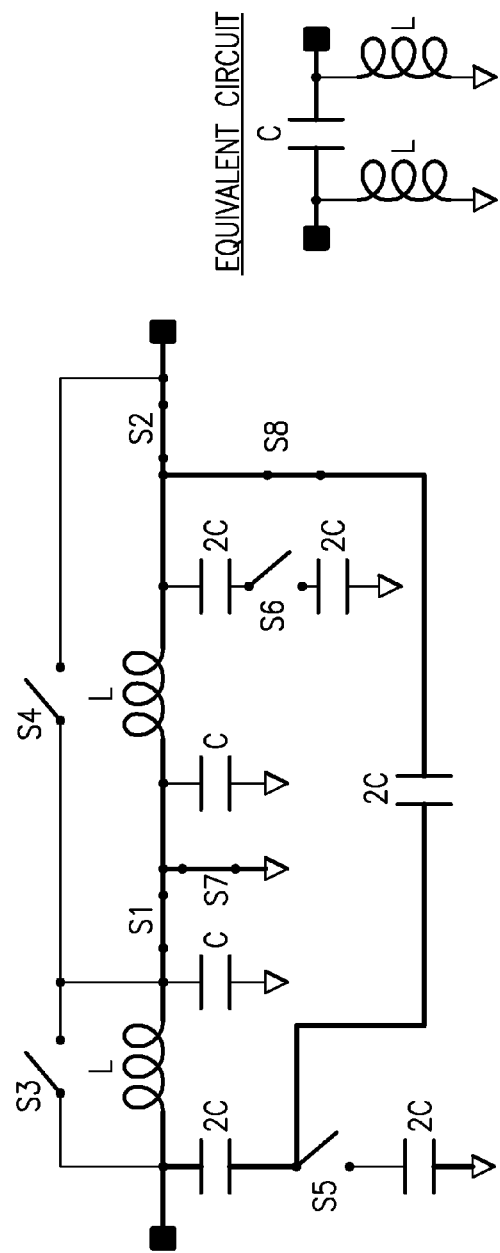
FIG.5
FIG.6

CIRCUITS, DEVICES AND METHODS RELATED TO QUADRANT PHASE SHIFTERS

CROSS-REFERENCE TO RELATED APPLICATION(S)

This application claims priority to U.S. Provisional Application No. 62/211,778 filed Aug. 29, 2015, entitled CIRCUITS, DEVICES AND METHODS RELATED TO QUADRANT PHASE SHIFTERS, the disclosure of which is hereby expressly incorporated by reference herein in its entirety.

BACKGROUND

Field

The present disclosure relates to circuits providing quadrant phase shifting of signals.

Description of the Related Art

In many digital communications applications, it is desirable to be able to shift the phase of a signal. For example, phase shifters are commonly used in signal cancellers and equalizers. Phase shifters are also used in beam steering, where a phased antenna array directs the antenna energy in a desired direction, which is commonly used in radar and non-line-of-sight (NLOS) operations. In dynamic gain equalizers, phase shifters are used to fit the attenuation profile of the equalizer to a desired one to compensate for non-flat gain responses across a communication band. Other applications can also utilize phase shifters.

SUMMARY

In some implementations, the present disclosure relates to a phase shifter configured to provide a bypass state, a single first-handed quarter-wave state, a double first-handed quarter-wave state, or a single second-handed quarter-wave state utilizing two or less inductors.

In some embodiments, the first-handed quarter-wave state can be a right-handed quarter-wave state, and the second-handed quarter-wave state can be a left-handed quarter-wave state. The bypass state, the single right-handed quarter-wave state, the double right-handed quarter-wave state, or the single left-handed quarter-wave state can yield a phase shift of approximately 0°, −90°, −180°, or +90°, respectively.

According to a number of implementations, the present disclosure relates to a phase shifter that includes a first node and a second node, and a first switchable path having a first inductance and a second inductance arranged in series between the first and second nodes. The phase shifter further includes a capacitive grounding path implemented on each side of each of the first and second inductances, with at least one of the capacitive grounding paths being configured as a switchable capacitive grounding path. The phase shifter further includes a reconfiguring circuit assembly configured to allow the phase shifter to provide a plurality of quadrant phase shifts utilizing the first and second inductances and the at least one switchable capacitive grounding path.

In some embodiments, the reconfiguring circuit assembly can include a first switch between the first and second inductances, and a second switch between the second inductance and the second node. The reconfiguring circuit assembly can further include a switchable bypass path assembly having third and fourth switches implemented in series between the first and second nodes, and a connection from a node between the third and fourth switches and a node between the first inductance and the first switch. The reconfiguring circuit assembly can be configured with each of the first and second switches open, and each of the third and fourth switches closed, to yield a bypass mode in which a phase shift of approximately 0° is achieved between the first and second nodes.

In some embodiments, the capacitive grounding paths associated with the first inductance can include a capacitance with a value of C implemented at the node between the first inductance and the first switch, and a first switchable capacitive grounding path having a capacitance with a value of 2C, a fifth switch, and a capacitance with a value of 2C, arranged in series between the first node and ground. The reconfiguring circuit assembly can be configured with each of the first, second and third switches open, and each of the fourth and fifth switches closed, to yield a shift mode in which a phase shift of approximately −90° is achieved between the first and second nodes.

In some embodiments, the capacitive grounding paths associated with the second inductance can include a capacitance with a value of C implemented at the node between the second inductance and the first switch, and a second switchable capacitive grounding path having a capacitance with a value of 2C, a sixth switch, and a capacitance with a value of 2C, arranged in series from a node between the second inductance and the second switch to ground. The reconfiguring circuit assembly can be configured with each of the third and fourth switches open, and each of the first, second, fifth and sixth switches closed, to yield a shift mode in which a phase shift of approximately −180° is achieved between the first and second nodes.

In some embodiments, the reconfiguring circuit assembly can further include a seventh switch implemented between ground and a node between the first switch and the second inductance, and a switchable path, having an eighth switch and a capacitance with a value of 2C in series, implemented from the node between the second inductance and the second switch to a node between the fifth switch and the 2C-capacitance closer to the first node. The reconfiguring circuit assembly can be configured with each of the third, fourth, fifth and sixth switches open, and each of the first, second, seventh and eighth switches closed, to yield a shift mode in which a phase shift of approximately +90° is achieved between the first and second nodes.

In some embodiments, the first node can be an input node, and the second node can be an output node. In some embodiments, the phase shifter can further include a fine phase shifter circuit coupled to the output node. The fine phase shifter circuit can include a first transmission line element having an inductance and a variable capacitance on each side of the inductance, such that the fine phase shifter circuit provides a phase shift in an increment having a magnitude that is less than the smallest magnitude of the non-zero quadrant shifts. The fine phase shifter circuit can further include a second transmission line element in series with the first transmission line element, with the second transmission line element including an inductance and a variable capacitance on each side of the inductance. In a number of teachings, the present disclosure relates to a method for adjusting phase of a signal. The method includes providing two or less inductors, and generating a bypass state, a single first-handed quarter-wave state, a double first-handed quarter-wave state, or a single second-handed quarter-wave state utilizing the two or less inductors.

In some teachings, the present disclosure relates to a method for adjusting phase of a signal. The method includes receiving a signal on a first node, and routing the signal to a second node through a phase shifting circuit that includes a first switchable path having a first inductance and a second inductance arranged in series between the first and second nodes. The phase shifting circuit further includes a capacitive grounding path implemented on each side of each of the first and second inductances, with at least one of the capacitive grounding paths being configured as a switchable capacitive grounding path. The phase shifting circuit further includes a reconfiguring assembly configured to allow the phase shifting circuit to provide a plurality of quadrant phase shifts utilizing the first and second inductances and the at least one switchable capacitive grounding path.

According to some implementations, the present disclosure relates to a semiconductor die having a semiconductor substrate and a phase shifting circuit implemented on the semiconductor die. The phase shifting circuit is configured to provide a bypass state, a single first-handed quarter-wave state, a double first-handed quarter-wave state, or a single second-handed quarter-wave state utilizing two or less inductors.

According to a number of implementations, the present disclosure relates to a semiconductor die having a semiconductor substrate and a phase shifting circuit implemented on the semiconductor die. The phase shifting circuit includes a first node and a second node, and a first switchable path having a first inductance and a second inductance arranged in series between the first and second nodes. The phase shifting circuit further includes a capacitive grounding path implemented on each side of each of the first and second inductances, with at least one of the capacitive grounding paths being configured as a switchable capacitive grounding path. The phase shifting circuit further includes a reconfiguring circuit assembly configured to allow the phase shifting circuit to provide a plurality of quadrant phase shifts utilizing the first and second inductances and the at least one switchable capacitive grounding path.

In some embodiments, the semiconductor substrate can include a silicon-on-insulator (SOI) substrate. In some embodiments, the semiconductor die can further include a fine phase shifter circuit coupled to the output node. The fine phase shifter circuit can include a first transmission line element having an inductance and a variable capacitance on each side of the inductance, such that the fine phase shifter circuit provides a phase shift in an increment having a magnitude that is less than the smallest magnitude of the non-zero quadrant shifts.

In some implementations, the present disclosure relates to an electronic module that includes a packaging substrate configured to receive one or more components, and a die mounted on the packaging substrate. The die includes a phase shifting circuit configured to provide a bypass state, a single first-handed quarter-wave state, a double first-handed quarter-wave state, or a single second-handed quarter-wave state utilizing two or less inductors.

In some embodiments, the two or less inductors can be implemented on the die.

In some implementations, the present disclosure relates to an electronic module having a packaging substrate configured to receive one or more components, and a die mounted on the packaging substrate. The die includes a phase shifting circuit having a first node and a second node, and a first switchable path having a first inductance and a second inductance arranged in series between the first and second nodes. The phase shifting circuit further includes a capacitive grounding path implemented on each side of each of the first and second inductances, with at least one of the capacitive grounding paths being configured as a switchable capacitive grounding path. The phase shifting circuit further includes a reconfiguring circuit assembly configured to allow the phase shifting circuit to provide a plurality of quadrant phase shifts utilizing the first and second inductances and the at least one switchable capacitive grounding path.

In some embodiments, the electronic module can further include a fine phase shifter circuit coupled to the output node. The fine phase shifter circuit can include a first transmission line element having an inductance and a variable capacitance on each side of the inductance, such that the fine phase shifter circuit provides a phase shift in an increment having a magnitude that is less than the smallest magnitude of the non-zero quadrant shifts. The fine phase shifter circuit can be implemented substantially on the same die as the phase shifting circuit.

According to some implementations, the present disclosure relates to an electronic device having a processor configured facilitate processing of a signal. The electronic device further includes a phase shifting circuit configured to provide a bypass state, a single first-handed quarter-wave state, a double first-handed quarter-wave state, or a single second-handed quarter-wave state for the signal utilizing two or less inductors.

In a number of implementations, the present disclosure relates to an electronic device having a processor configured facilitate processing of a signal, and a phase shifting circuit configured to provide a phase shift for the signal. The phase shifting circuit includes a first node and a second node, and a first switchable path having a first inductance and a second inductance arranged in series between the first and second nodes. The phase shifting circuit further includes a capacitive grounding path implemented on each side of each of the first and second inductances, with at least one of the capacitive grounding paths being configured as a switchable capacitive grounding path. The phase shifting circuit further includes a reconfiguring circuit assembly configured to allow the phase shifting circuit to provide a plurality of quadrant phase shifts utilizing the first and second inductances and the at least one switchable capacitive grounding path.

In some embodiments, the electronic device can further include a communication component configured to facilitate interaction with another electronic device and/or a user. The electronic device can include, for example, a wireless device.

According to a number of implementations, the present disclosure relates to a phase shifter having a first node and a second node, and a first transmission line element having an inductance and a variable capacitance on each side of the inductance. The variable capacitance is configured to provide a plurality of capacitance values to yield corresponding phase shift values based on an increment having a magnitude that is less than 90 degrees.

In some embodiments, the phase shifter can further include a second transmission line element in series with the first transmission line element. The second transmission line element can have an inductance and a variable capacitance on each side of the inductance configured to extend an overall phase shift range provided by the phase shifter.

In some embodiments, the variable capacitance can be provided by a switchable circuit having a plurality of capacitive paths arranged in parallel, with each capacitive path including at least one capacitor in series with a switch. The capacitive path can include a first capacitor and a second capacitor arranged such that the switch is between the first and second capacitors. The series arrangement of the first capacitor, the switch, and the second capacitor can be configured to provide DC blocking functionality.

In some embodiments, the first and second capacitors can have substantially same capacitance values. The series arrangement of the first capacitor, the switch, and the second capacitor can be configured to provide a substantially symmetric capacitance for the capacitive path.

In some embodiments, the switch can include a field-effect transistor (FET) such that source and drain of the FET are connected to the first and second capacitors. The FET can be biased such that its channel and gate are biased to opposite potentials.

In some embodiments, the phase shifter can further include a quadrant phase shifter coupled to one of the first and second nodes. The quadrant phase shifter can be configured to provide a bypass state, a single first-handed quarter-wave state, a double first-handed quarter-wave state, or a single second-handed quarter-wave state utilizing two or less inductors. The quadrant phase shifter can include two inductors, such that the phase shifter includes four inductors. The four states of the quadrant phase shifter can be achieved by a 2-bit control signal over the four quadrants. The switchable circuit can include four capacitive paths to provide a 4-bit variable capacitance values over a range of at least 90 degrees. The phase shifter can have a 6-bit phase shift resolution over a range of at least 360 degrees.

In some implementations, the present disclosure relates to a method for adjusting phase of a signal. The method includes providing a transmission line element having an inductance and a variable capacitance on each side of the inductance. The method further includes controlling the variable capacitance to provide a plurality of capacitance values to yield corresponding phase shift values based on an increment having a magnitude that is less than 90 degrees.

In some implementations, the present disclosure relates to a semiconductor die having a semiconductor substrate and a phase shifting circuit implemented on the semiconductor die. The phase shifting circuit includes a first node and a second node, and a first transmission line element having an inductance and a variable capacitance on each side of the inductance. The variable capacitance is configured to provide a plurality of capacitance values to yield corresponding phase shift values based on an increment having a magnitude that is less than 90 degrees.

In some embodiments, the phase shifting circuit can further include a second transmission line element in series with the first transmission line element. The second transmission line element can have an inductance and a variable capacitance on each side of the inductance configured to extend an overall phase shift range provided by the phase shifter.

In some embodiments, the semiconductor substrate can include a silicon-on-insulator (SOI) substrate.

In some embodiments, the semiconductor die can further include a quadrant phase shifter coupled to one of the first and second nodes. The quadrant phase shifter can be configured to provide a bypass state, a single first-handed quarter-wave state, a double first-handed quarter-wave state, or a single second-handed quarter-wave state utilizing two or less inductors.

According to some teachings, the present disclosure relates to an electronic module having a packaging substrate configured to receive one or more components, and a die mounted on the packaging substrate. The die includes a phase shifting circuit having a first node and a second node. The phase shifting circuit further includes a first transmission line element having an inductance and a variable capacitance on each side of the inductance. The variable capacitance is configured to provide a plurality of capacitance values to yield corresponding phase shift values based on an increment having a magnitude that is less than 90 degrees.

In some embodiments, the phase shifting circuit can further include a second transmission line element in series with the first transmission line element. The second transmission line element can have an inductance and a variable capacitance on each side of the inductance configured to extend an overall phase shift range provided by the phase shifter.

In some embodiments, the electronic module can further include a quadrant phase shifter coupled to one of the first and second nodes. The quadrant phase shifter can be configured to provide a bypass state, a single first-handed quarter-wave state, a double first-handed quarter-wave state, or a single second-handed quarter-wave state utilizing two or less inductors.

In some embodiments, the inductances associated with the first and second transmission lines and the two or less inductors of the quadrant phase shifter can include corresponding inductors implemented on the die.

In accordance with some implementations, the present disclosure relates to an electronic device having a processor configured facilitate processing of a signal. The electronic device further includes a phase shifting circuit having a first node and a second node. The phase shifting circuit further includes a first transmission line element having an inductance and a variable capacitance on each side of the inductance. The variable capacitance is configured to provide a plurality of capacitance values to yield corresponding phase shift values based on an increment having a magnitude that is less than 90 degrees.

In some embodiments, the electronic device can further include a communication component configured to facilitate interaction with another electronic device and/or a user. The electronic device can include, for example, a wireless device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Aspects of this disclosure will be described in more detail by way of example only with reference to the accompanying drawings. The components within the drawings are not necessarily to scale, emphasis instead being placed upon clearly illustrating principles.

FIG. 5 is a circuit diagram of a third configuration of a phase shifter embodying an aspect of the present disclosure.

FIG. 6 is a circuit diagram of a fourth configuration of a phase shifter embodying an aspect of the present disclosure.

DETAILED DESCRIPTION OF SOME EMBODIMENTS

The headings provided herein, if any, are for convenience only and do not necessarily affect the scope or meaning of the claimed invention.

Examples related to a compact architecture for a passive 6-bit digital phase shifter are disclosed. In some embodiments, a phase shifter can have a range of 360° with 5.6° resolution at 2.4 GHz. Such an architecture can include an ambidextrous quadrant selector in series with a digital fine-tuned phase shifter which makes use of high-ratio symmetrical digitally variable capacitors loading a lumped element transmission line. The example phase shifter can achieve a 50Ω match in all 64 states. The example circuit occupies approximately 0.47 mm² on die, and the entire example test chip measured 0.84 mm² including bond pads and ESD structures. The example chip was fabricated in a commercial 0.13 μm SOI (Silicon-on-Insulator) CMOS process.

Introduction:

Phase shifting is an important operation in many RF applications. For example, phase shifters are commonly used in signal cancellers and equalizers. Phase shifters are also used in beam steering, where a phased antenna array directs the antenna energy in a desired direction, which is commonly used in radar and non-line-of-sight (NLOS) operations. In dynamic gain equalizers, phase shifters are used to fit the attenuation profile of the equalizer to a desired one to compensate for non-flat gain responses across a communication band. Other applications can also utilize phase shifters.

Disclosed are examples of one or more designs related to a highly compact phase shifter that can include a digitally tuned transmission line and an ambidextrous quadrant selector. While it is not desired or intended to be bound by any particular theory or model, described herein are examples related to basic theory surrounding lumped element transmission lines to facilitate description of architectures associated with a quadrant selector and/or a fine tuning phase shifter. Examples of measured results and comparison to theory and other phase shifters are also disclosed.

Figure 1:
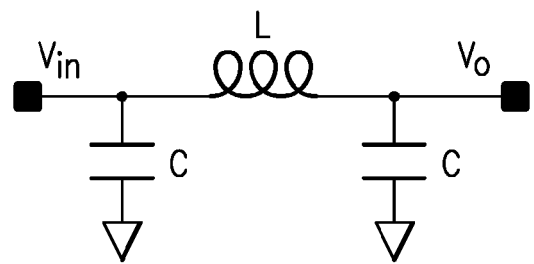
FIG. 1 is a circuit diagram of a lumped element transmission line.

Examples Related to Basic Theory:

A lumped element quarter wave transmission line, shown in FIG. 1, has a characteristic impedance, $Z_0$ that can be expressed as $$Z_0 = \sqrt{\frac{L}{C}}, \quad (1)$$

and a corner frequency, $\omega_0$ that can be expressed as $$\omega_o = \frac{1}{\sqrt{LC}}. \quad (2)$$

A change in inductance or capacitance will change the corner frequency of the system, and thus the phase of the signal at the output will change as well. Inductance is typically not easily altered; however, capacitance can be more readily variable with an appropriate device, such as a MOS varactor. Therefore, in a lumped element transmission line, utilizing a variable capacitance can alter the phase of the signal at the output.

The example lumped element circuit in FIG. 1 typically has a low pass response up to the corner frequency response indicated in Equation 2. Below this corner frequency, the gain response is typically fairly flat, but phase can be changing. As a result, the phase can be altered while the gain of the system remains relatively flat by changing the corner frequency of the system within the pass band region close to the corner frequency.

Using a fine tuning system by altering the corner frequency of a circuit similar to FIG. 1 can enable fine tuning. In order to cover 360°, a coarse tuning can be utilized as well. For example, a coarse phase shifting can include one or more 90-degree shifts. With a fixed L, C and $Z_0$, the electrical length of a lumped transmission line can be substantially constant at a given frequency. Using one or more fixed quarter wave (90°) transmission lines, different quadrants (e.g., 0°, 90°, 180°, 270°) can be selected using switches to obtain the example coarse phase shift. Such a technique can yield 360° total range when paired together with a variable capacitor loaded transmission line.

Examples of Architectures:

Ambidextrous Quadrant Shifter

In some embodiments, a quadrant shifter can be designed by utilizing fixed quarter wave transmission lines that can be switched in or out to select a quadrant desired. For example, to select the four quadrants, one can implement three quarter wave sections selectable by switches. With three sections, there would be three inductors which can be main area consumer in this example circuit.

Figure 2:
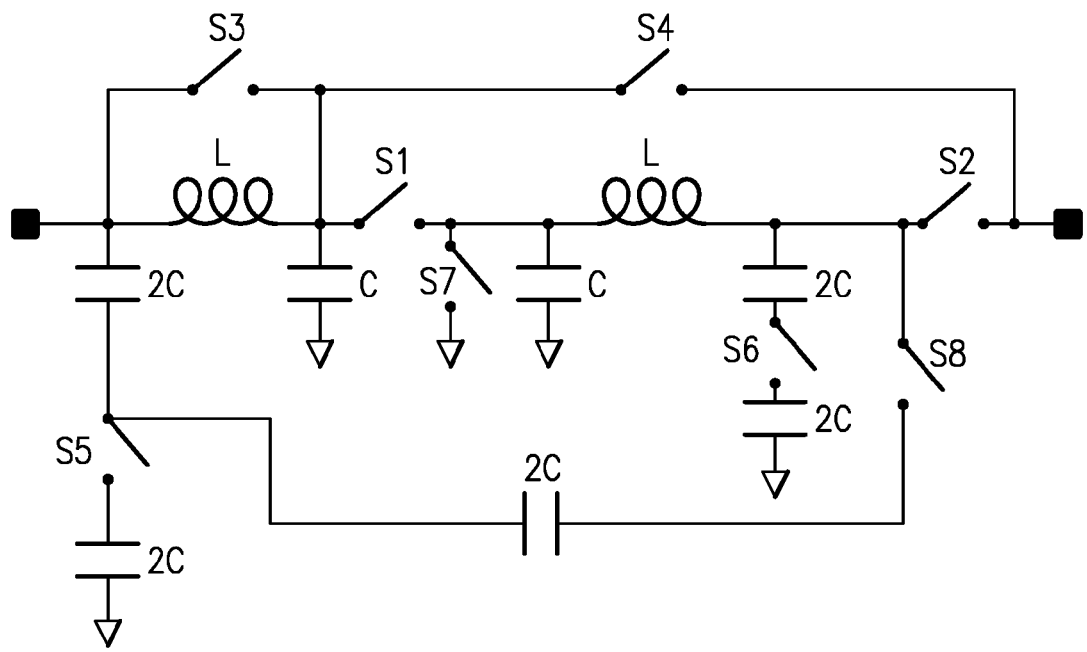
FIG. 2 is a circuit diagram of phase shifter, in accordance with some implementations.

An example architecture shown in FIG. 2 can employ inductor reuse in combination with switches to accomplish substantially the same goal, but with two inductors instead of three. It can achieve such functionality by electrically reconfiguring the circuit's inductors between series and parallel connections to make use of left handed lumped transmission lines, which can provide substantially the opposite phase shift of the right handed version shown in FIG. 1. The architecture can be configured to select between some or all of bypass, single right handed quarter wave, double right handed quarter wave, and single left handed quarter wave states, which can provide 0°, 90°, 180° and +90° of phase shift respectively. The example architecture shown in FIG. 2 can provide such phase shifting functionality, and examples of how each quadrant state can be achieved are described herein in greater detail.

FIGS. 3-6 show example configurations of the architecture of FIG. 2 for generating the foregoing bypass, single right handed quarter wave, double right handed quarter wave, and single left handed quarter wave states. In FIGS. 3-6, switches S1, S2, S3, S4, S5, S6, S7 and S8 can be in states as shown to achieve such states.

Figure 3:
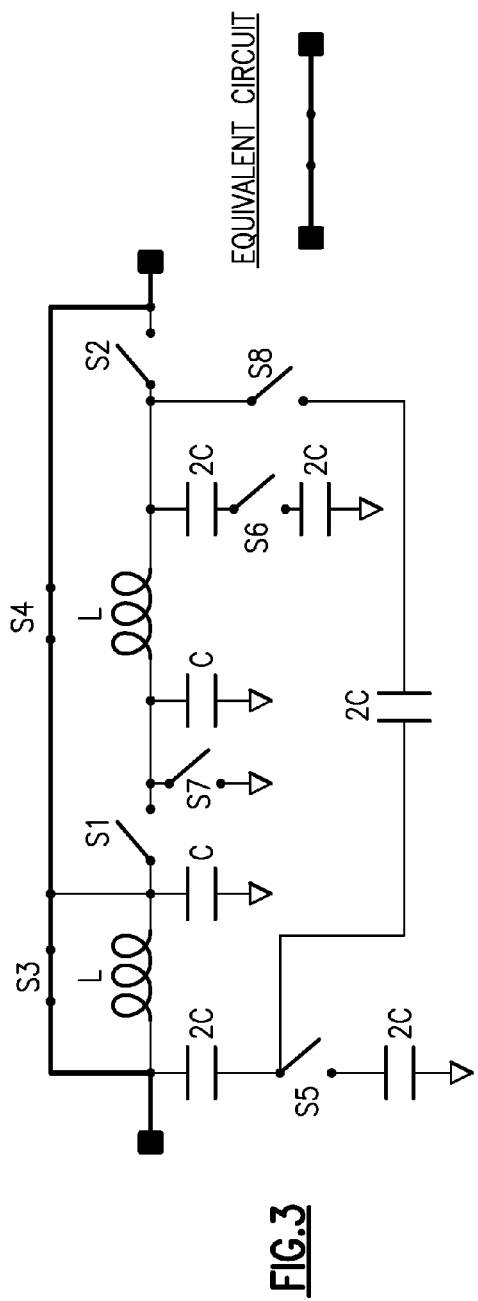
FIG. 3 is a circuit diagram of a first configuration of a phase shifter embodying an aspect of the present disclosure.

Bypass, 0°: In a bypass state, both bypass switches (S3, S4) can be closed (ON), and all other switches can be opened (OFF), as shown in FIG. 3. It is noted that in some embodiments, one shunt capacitor C to ground could also be removed with another switch.

Figure 4:
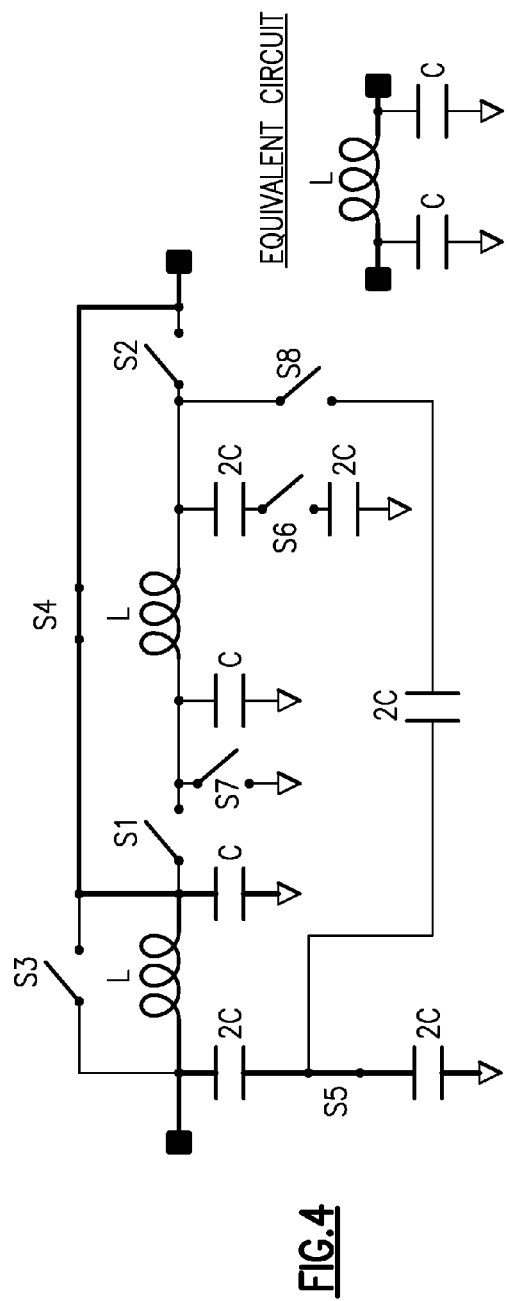
FIG. 4 is a circuit diagram of a second configuration of a phase shifter embodying an aspect of the present disclosure.

Single Quarter Wave Transmission Line, −90°: A single right handed transmission line can be formed by creating a shunt C at the input, and activating the bypass switch at the output, as shown in FIG. 4. More particularly, a shunt switch S5 can be closed, the bypass switch S4 can be closed, and all other switches can be opened.

Double Quarter Wave Transmission Line, −180°: As shown in FIG. 5, two series quarter wave transmission lines can be formed to produce a 180° phase shift. Such a configuration can be achieved by shunt switches S5 and S6, and switches S1 and S2 being closed as shown, and all other switches being open.

Left-Handed Quarter Wave Transmission Line, +90°: As shown in FIG. 6, both inductors can be shunted to ground from the input and output using a switch S7 to ground in the middle of the circuit. For example, switches S1, S2, S7 and S8 can be closed, and all other switches can be opened. In such a configuration, a series capacitance C can be created using the series combination of the capacitance 2C at the input and 2C connecting to the output through the closed switch S8. The previously shunted capacitance 2C to ground is disconnected by opening the shunt switch S5 at the input. Such a configuration creates a left handed transmission line with two series capacitors of 2C, creating C, and two shunt inductors to ground.

Referring to the examples of FIGS. 2-6, it is noted that in addition to a significant area reduction, this design can also provide a more consistent loss between states and a lower maximum loss than that of traditional three quarter wave transmission lines. For example, the architecture of FIGS. 2-6 can have the most loss in the double transmission line state, rather than triple in the traditional configuration.

Fine Phase Shifter:

In some embodiments, a fine tuning phase shifter can include two series lumped element transmission lines similar to the example shown in FIG. 1, where some or all of the capacitors can be replaced with variable capacitors to enable tuning. An example of such a fine tuning phase shifter is shown in FIG. 7.

Figure 7:
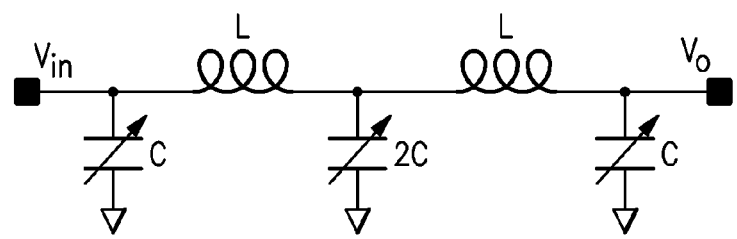
FIG. 7 is a circuit diagram of a fine tuning phase shifter, in accordance with some implementations.

Referring to the example of FIG. 7, such an architecture can utilize high-ratio variable capacitors described herein in order to, for example, achieve 90° of total phase shift while maintaining, for example, a 50Ω match with two inductors. In some embodiments, each capacitor can have a 4-bit resolution, thereby enabling approximately 6° resolution $(90/(2^4) \approx 6)$ for 90° of total phase shift.

A theoretical phase shift vs. capacitance can be derived from the example configuration of FIG. 7 using Kirchoff's Voltage Law. Assuming a 50Ω voltage source at $V_{in}$ and 50Ω load at $V_0$, a transfer function $V_{out}/V_{source}$ can be expressed in terms of impedances as:

$$\frac{V_{out}}{V_{in}} = \left(\frac{Z_C \| 50}{Z_L + Z_C \| 50}\right)\left(\frac{\frac{Z_C}{2}\|(Z_L + (Z_C \| 50))}{Z_L + \left(\frac{Z_C}{2}\|(Z_L + (Z_C\|50))\right)}\right) \quad (3)$$

$$\left(\frac{Z_C \| \left(Z_L + \left(\frac{Z_C}{2}\|(Z_L + (Z_C\|50))\right)\right)}{50 + Z_C \| \left(Z_L + \left(\frac{Z_C}{2}\|(Z_L + (Z_C\|50))\right)\right)}\right).$$

When substituting $Z_C = (sC)^{-1}$ and $Z_L = sL$ into Equation 3, a Laplace transfer function can be obtained as:

$$\frac{V_{out}}{V_{in}}(s) = \frac{25}{2500C^3L^2s^5 + 100C^2L^2s^4 + (7500C^2L + CL^2)s^3 + 200CLs^2 + 5000Cs + Ls + 50}. \quad (4)$$

Further, substituting $s = j\omega$ and factoring into Cartesian form in the denominator, following expression can be obtained for $V_{out}/V_{in}$:

$$\frac{V_{out}}{V_{in}} = \frac{25}{100C^2L^2\omega^4 - 200CL\omega^2 + 50 + j(2500C^3L^2\omega^5 - (7500C^2L + CL^2)\omega^3 + (5000C + L)\omega)}. \quad (5)$$

Using Equations 1 and 2, and assuming a 50Ω transmission line at 2.4 GHz, example impedance values of L=3.32 nH and C=1.32 pF can be obtained for a fixed quarter wave transmission line. Using such an inductance value at 2.4 GHz, a phase shift can be found by use of Equation 5 for the angle of $V_{OUT}/V_{IN}$ at various capacitances. An example of such an output phase as a function of capacitance is shown in FIG. 8.

Figure 8:
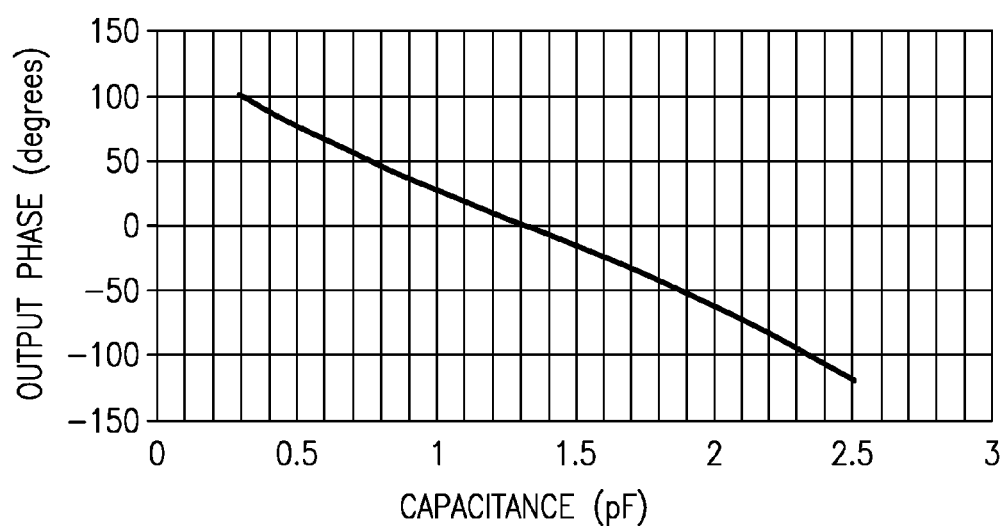
FIG. 8 is a plot of phase shift in accordance with an aspect of the present disclosure.

In the example of FIG. 8, one can see that the resulting phase shift is quite linear with respect to capacitance over a large range, which can then allow for a binary weighted digital capacitor to control the phase shift in an approximately linear fashion.

As an example, using ideal devices in FIG. 8, 90° of phase occurs between 0.5 pF and 1.5 pF, for a $C_{MAX}:C_{MIN}$ of 3:1, similar to MOS varactors. For a 360° application paired with a quadrant selector, some margin can be implemented to ensure no gaps occur from using real components and due to process variation; accordingly, a target starting design of, for example, at least 100 degrees can be selected. In addition, on chip devices can deviate from ideal; therefore, a variable capacitance with a ratio larger than 3:1 can be implemented to achieve 90° with two transmission line segments.

An input match is typically important for RF applications. Referring to FIG. 7, $Z_{IN}$, which can be assumed to be equal to $Z_{OUT}$, can be found as:

$$Z_{IN} = Z_C \left\| \left( Z_L + \left( \frac{Z_C}{2} \| (Z_L + (Z_C \| 50)) \right) \right) \right. \quad (6)$$

Figure 9:
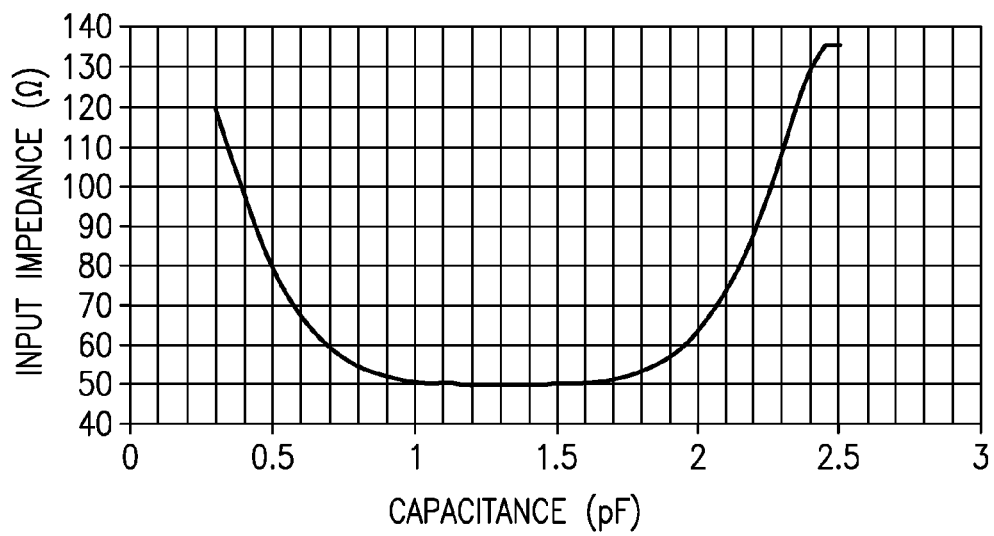
FIG. 9 is a plot of input impedance in accordance with an aspect of the present disclosure.

When Equation 6 is simplified into a Cartesian form and solved for magnitude, the input impedance for the example 2.4 GHz phase shifter can be as shown in FIG. 9. For RF applications, the foregoing design can be advantageous due to a consistent 50Ω match over a large range of capacitance values.

High Ratio Switched Variable Capacitors:

A phase shifter having one or more features as described herein can be designed to have a very low area use. Traditional MOS varactors typically have a $C_{MAX}$:$C_{MIN}$ near 3:1. By using real components such as MOS varactors instead of ideal components, the capacitance ratio would likely be insufficient to achieve greater than 90° of phase shift with two transmission line segments. Such a design can therefore utilize three series transmission lines to reach 90° of phase shift. However, if a variable capacitance with a higher ratio is utilized, a larger phase shift can be attainable and using two sections. Such a design can reduce the area considerably by being able to use two sections instead of three as compared to using MOS varactors.

Figure 10A:
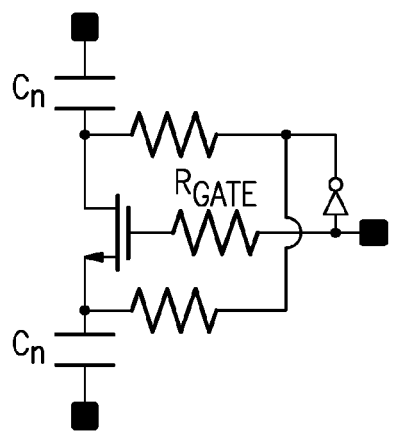
FIG. 10A is a schematic of a circuit embodying a switching capacitance in accordance with an aspect of the present disclosure.
Figure 10B:
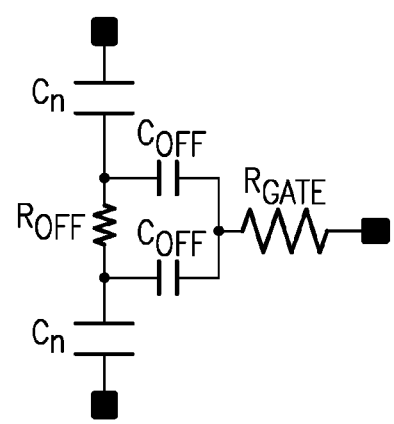
FIG. 10B is a schematic of a circuit embodying a switching capacitance in accordance with an aspect of the present disclosure.

Examples of circuits implementing a switchable capacitance are shown in FIGS. 10A and 10B. More particularly, FIG. 10A shows an example of a cross-biased switch, where gate and channel are inversely biased. FIG. 10B shows an equivalent circuit when the gate is low (off). It is noted that by using switches which are DC decoupled with fixed capacitors in parallel, capacitance can be added or removed digitally. Cross biasing of the switches as shown in FIG. 10A, where the channel and gate are biased to opposite potentials, can include a number of benefits.

For example, a benefit can include a feature where the switch does not turn on or turn off easily due to a high powered RF signal. Another advantage is that by splitting the desired capacitance into two series capacitors, they can also act to block DC. Accordingly, traditionally large (e.g., RF short) DC blocking capacitors are not required, which in turn can reduce area consumption. Another benefit associated with the design is that the capacitance will be generally symmetrical because the switch's source and drain are symmetrical; accordingly, the isolating capacitors can have approximately the same value if desired.

Figure 11:
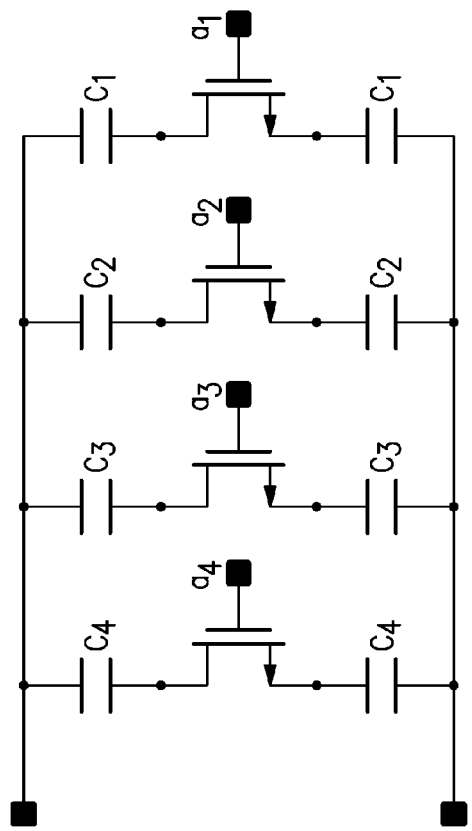
FIG. 11 is a schematic of a 4-bit variable capacitor in accordance with an aspect of the present disclosure.

FIG. 11 shows an example architecture of a 4-bit variable capacitor. In FIG. 11, a change in capacitance, $\Delta C_n$, can be toggled using a control signal $a_n$ at the gate of a respective switch. A desired capacitance step can be the difference between two $C_n$ in series with the $R_{ON}$ of the switch, and two $C_n$ and two $C_{OFF}$ in series as seen in FIG. 10B. The latter assumes a large $R_{GATE}$ resistor and a large $R_{OFF}$ of the switch. $C_{OFF}$ is the capacitance between source/drain and gate when the switch is off as shown in FIG. 10B. The difference $\Delta C_n$ can be expressed as:

$$\Delta C_n = \frac{C_n}{2} - \frac{C_n C_{OFF}}{2(C_n + C_{OFF})}. \quad (7)$$

In some embodiments, $C_n$ can be chosen to provide desired capacitance steps, and the number of bits can be expandable. Such a design can have a $C_{MAX}$:$C_{MIN}$ ratio dependent of the selected $C_n$ and only be limited at the low end by $C_{OFF}$. Therefore, a large highly-linear capacitance ratio can be achieved using this architecture.

Phase Shifter Assembly:

In some embodiments, a phase shifter assembly can include a fine shifter with high-ratio variable capacitors, as described herein, in series with an ambidextrous quadrant selector, also as described herein. Such a design can be implemented as a 6-bit phase shifter, for a total of 64 phases across 360°. In some embodiments, such a phase shifter assembly can be configured to be substantially entirely passive, and only draw current when changing states. An example of such a phase shifter is shown in FIG. 12.

Figure 12:
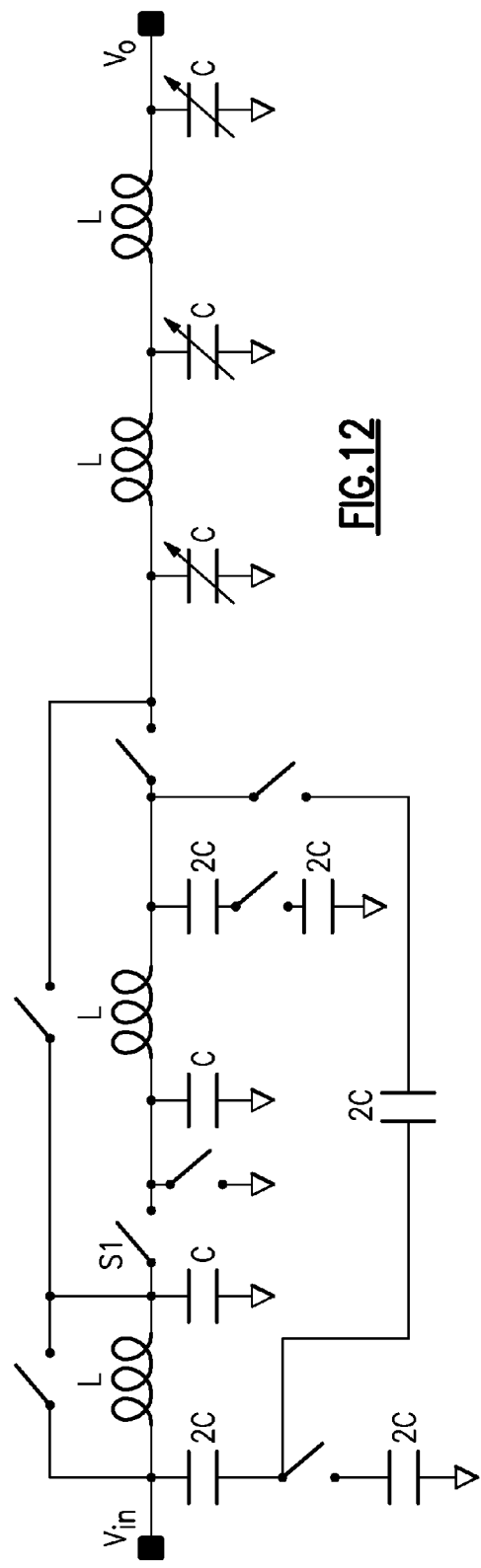
FIG. 12 is a schematic of a phase shifter assembly embodying an aspect of the present disclosure.
Figure 13:
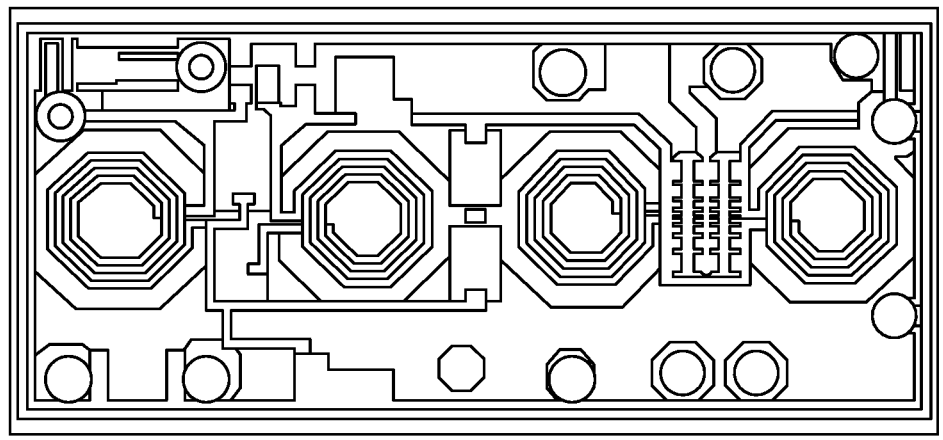
FIG. 13 is a top-down view of a fabricated chip embodying a phase shifter assembly in accordance with an aspect of the present disclosure.

Examples of Measured Results:

Measured performance of the phase shifter of FIG. 12 was obtained with a network analyzer. FIG. 13 shows a micrograph of a fabricated chip with the phase shifter of FIG. 12. The on chip area is approximately 0.47 mm², and the total area of the test die including bond pads and ESD is approximately 0.84 mm², with the overall dimensions being approximately 1400 μm×600 μm.

In the example of FIG. 13, the four coil traces are the four inductors in the phase shifter of FIG. 12. One can see that each inductor occupies a significant portion of the overall area; thus, eliminating an inductor as described herein can yield a desirable reduction in overall dimensions of related devices.

Figure 14:
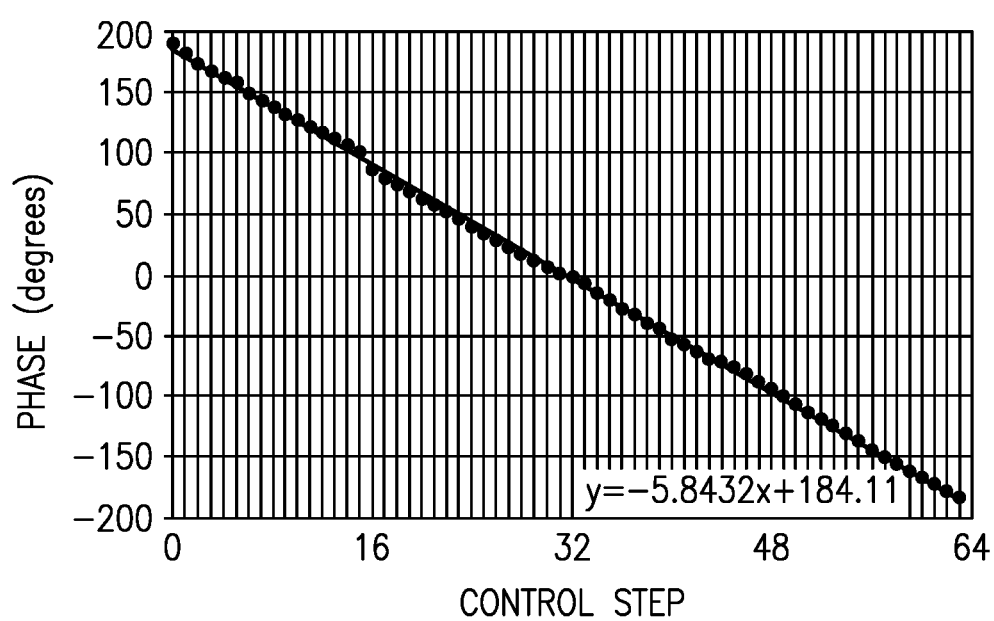
FIG. 14 is a plot of phase shift performance at 2.4 GHZ in accordance with an aspect of the present disclosure.

An example of phase shift performance at 2.4 GHz is shown in FIG. 14. The phase shifter of FIG. 12 is shown to achieve linear monotonic phase shift with an average phase step of 5.84° and a total phase range of 372°.

Figure 15:
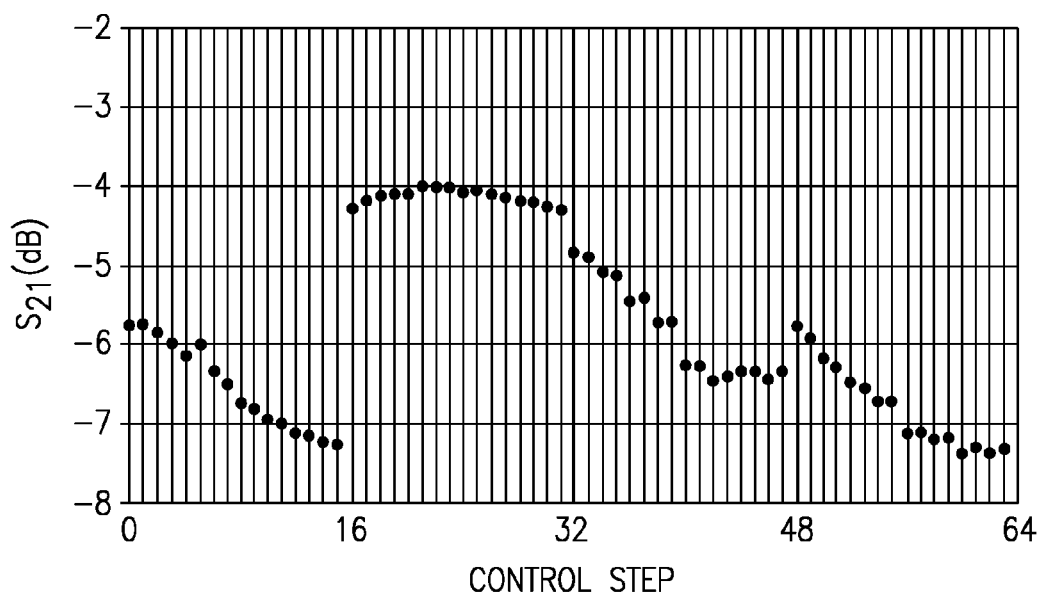
FIG. 15 is a plot of insertion loss in accordance with an aspect of the present disclosure.

An example $S_{21}$(dB) performance is shown in FIG. 15. One can see that $S_{21}$ is fairly consistent, varying between −4 and −7.4 dB at its extremes, or approximately −5.7±1.7 dB.

Figure 16:
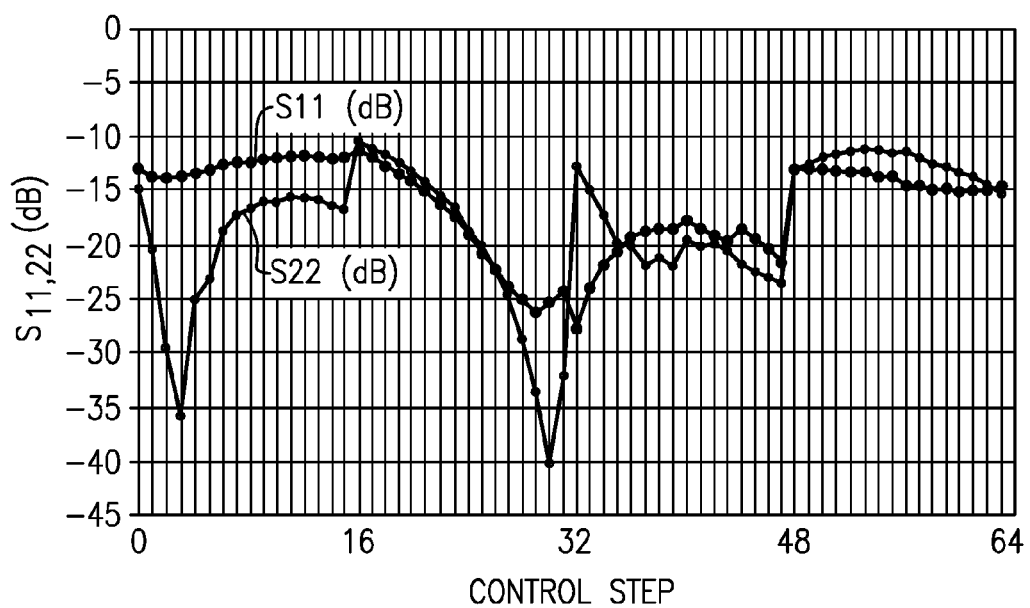
FIG. 16 is a plot of return loss performance in accordance with an aspect of the present disclosure.

An example return loss performance is shown in FIG. 16. One can see that the phase shifter remains well matched at 2.4 GHz over all phases at both the input and the output terminals.

Figure 17:
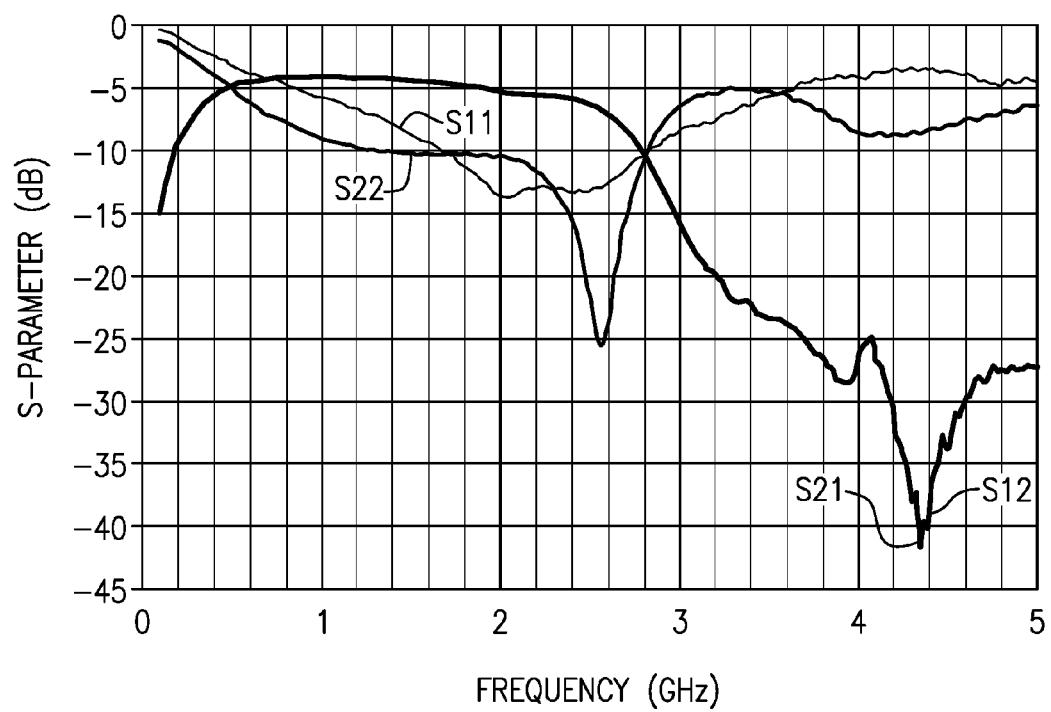
FIG. 17 is a plot of a frequency response in accordance with an aspect of the present disclosure.

An example frequency response for STEP=0 is shown in FIG. 17. More particularly, S-parameters S12, S21, S11 and S22 are plotted as a function of frequency from 100 MHz to 5 GHz.

As shown in the example of FIG. 17, the phase shifter is well matched (e.g., <−10 dB) in a frequency range of 1.7GHz to 2.8 GHz, and displays a stop band property after this region. In some embodiments, lower loss can be achieved by, for example, higher Q inductors and/or wider RF paths in a metal layer (e.g., top metal layer) of the phase shifter chip.

A comparison of properties associated with the present disclosure to other works is found in Table I.

TABLE 1

| Freq. (GHz) | No. of Bits | Insertion Loss (dB) | Area (mm²) | Technology |
|---|---|---|---|---|
| 2.4 | 6 | 5.7 ± 1.7 | 0.47 | 130 nm SOI CMOS |
| 2.5-3.2 | 6 | 13* | 3.1** | 180 nm CMOS |
| 1.4-2.4 | 6 | 3.8 ± 0.4 | 3.8 | 0.5 μm GaAs pHEMT |
| 1.4-2.4 | 4 | 3.8 ± 0.4 | 2.6 | 400 nm GaAs |
| 11.6-12.6 | 4 | 9 ± 0.5* | 1.72 | 180 nm RF CMOS |
| 1.4-1.7 | 9 | 9.3 ± 3.3 | 5.94 | 250 nm SOS |
| 1.8-2.4 | 10 | 5.1 ± 2.2 | 3.4 | 250 nm SOS |

In Table 1, phase shifter chip of FIGS. 12 and 13 is listed on the top row, implemented as 130 nm SOI CMOS technology. In Table 1, the insertion loss estimate of 13 dB for the 180 nm CMOS technology example is without amplification (active), and the listed area of 3.1 mm² is an estimate based on a die photograph.

Based on the comparison in Table 1, one can see that the phase shifter of FIGS. 12 and 13 has an insertion loss that is competitive relative to other designs, but not the best one. However, for all of the compared digital phase shifters, the phase shifter of FIGS. 12 and 13 is shown to occupy nearly four times less area than the next smallest device (1.72 mm² for the 180 nm RF CMOS technology example, with a frequency range of 11.6-12.6 GHz).

It is noted that such an 180 nm RF CMOS device is designed for a much higher frequency (11.6-12.6 GHz), and therefore, components can be typically smaller. When one compares the phase shifter of FIGS. 12 and 13 to examples in similar frequency ranges, the most area-efficient example (180 nm CMOS of the second row) has an area of 3.1 mm². Accordingly, the phase shifter of FIGS. 12 and 13 can be considered to have at least a six-fold improvement in area-efficiency over other digital phase shifters in a similar frequency range.

As described herein, a passive digital phase shifter having one or more features as described herein can provide, among others, a significant advantage in area efficiency. In addition, and as described herein, insertion loss performance can be improved with such an area efficiency.

A compact yet high performance 6-bit phase shifter has been described and demonstrated. Such a phase shifter provides performance comparable to other phase shifter designs, yet occupies less than 20% of the area.

Examples of Devices and Products:

As one can appreciate, a phase shifter having one or more features as described herein can be utilized in many electronic applications, including but not limited to RF applications. Such electronic applications can include, for example, phased array systems, frequency synthesizers, various wireless applications, etc.

Figure 18A:
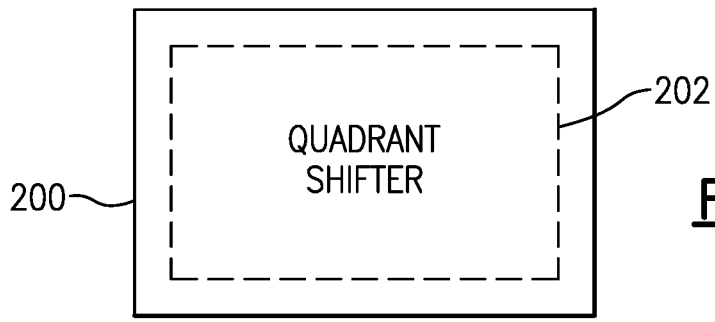
FIGS. 18A-18C illustrate block diagrams of implementations of phase shifters on a semiconductor die, in accordance with one or more aspects of the present disclosure.
Figure 18B:
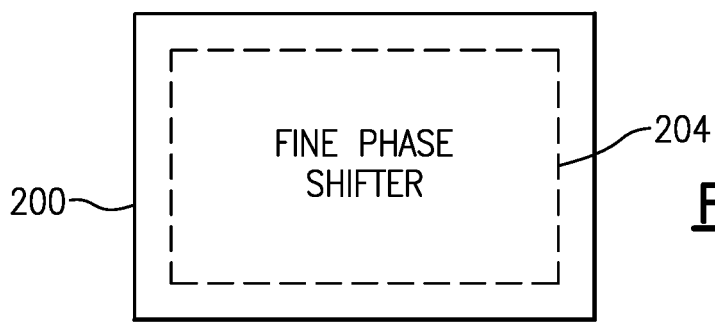
Figure 18C:
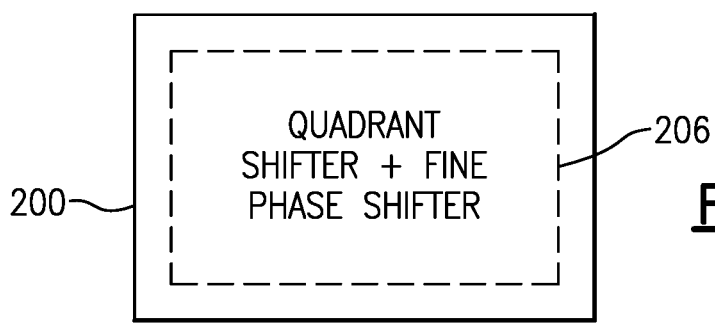
Figure 19:
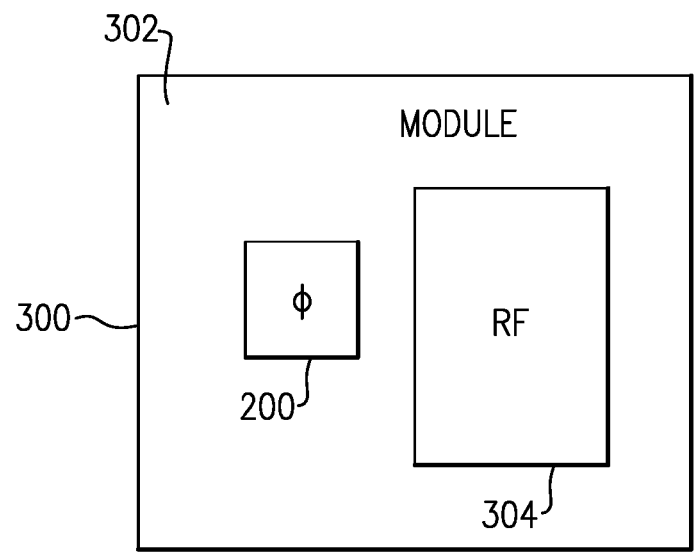
FIG. 19 illustrates a block diagram of a phase shifter implemented in a packaged module format, in accordance with one or more aspects of the present disclosure.
Figure 20:
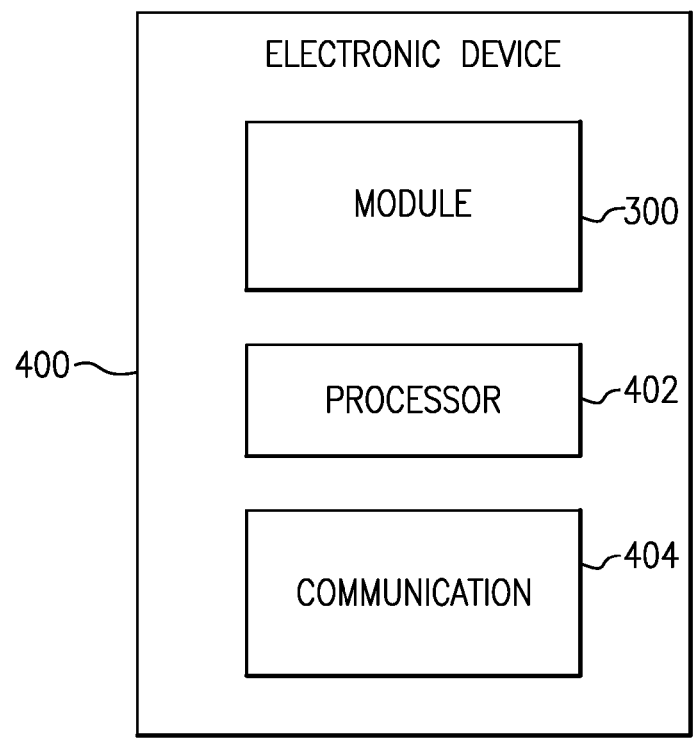
FIG. 20 illustrates a block diagram of an electronic device implementing a phase shifter in accordance with one or more aspects of the present disclosure.

FIGS. 18-20 show non-limiting examples of how a phase shifter having one or more features as described herein can be implemented in different products. For example, FIGS. 18A-18C show examples where a phase shifter can be implemented in a semiconductor die format. FIG. 18A shows that in some embodiments, a semiconductor die 200 can include a quadrant shifter 202 having one or more features as described herein (e.g., FIGS. 2-6). FIG. 18B shows that in some embodiments, a semiconductor die 200 can include a fine phase shifter 204 having one or more features as described herein (e.g., FIGS. 7-11). FIG. 18C shows that in some embodiments, a semiconductor die 200 can include a phase shifter 206 having functionalities associated with both of the quadrant shifter and the fine phase shifter (e.g., FIG. 12).

FIG. 19 shows that in some embodiments, a phase shifter having one or more features as described herein can be implemented in a packaged module format. For example, a packaged module 300 can include a packaging substrate 302 configured to receive a plurality of components. Such components can include a phase shifter 200 implemented in, for example, a die format. Such a phase shifter can facilitate operation of, for example, an RF circuit device 304.

In the example of FIG. 19, the phase shifter die 200 is depicted as being a separate device from the RF circuit device 304. However, it will be understood that a phase shifter having one or more features as described herein can also be part of the RF circuit device 304 (e.g., in a die format), or any combination thereof.

In the example of FIG. 19, the phase shifter is depicted as facilitating the operation of the RF circuit device. It will be understood that the module 300 can include a non-RF device (that operates with the phase shifter) instead of the RD device (304), in addition to the RF device, or any combination thereof.

FIG. 20 depicts an electronic device 400 having a module 300 such as the example of FIG. 19. Such a device can also include, for example, a processor 402 and a communication component 404. Such a communication component can include, for example, circuits and/or devices that allow the electronic device 400 to communicate with another device (e.g., wireless or wired communication), a user (e.g., a user interface), or any combination thereof.

In the example of FIG. 20, a phase shifter having one or more features as described herein is depicted as being implemented in a module format. It will be understood that such a phase shifter can also be implemented in a die format, in a circuit format, etc., or any combination thereof.

In some implementations, the electronic device of FIG. 20 can be, for example, a wireless device. In some embodiments, such a wireless device can include, for example, a cellular phone, a smart-phone, a hand-held wireless device with or without phone functionality, a wireless tablet, a wireless router, a wireless modem configured to support machine type communications, a wireless access point, a wireless base station, etc.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase shifter comprising:
   a first node and a second node;
   a first switchable path having a first inductance and a second inductance arranged in series between the first and second nodes;
   a capacitive grounding path implemented on each side of each of the first and second inductances, at least one of the capacitive grounding paths configured as a switchable capacitive grounding path; and
   a reconfiguring circuit assembly configured to allow the phase shifter to provide a plurality of quadrant phase shifts utilizing the first and second inductances and the at least one switchable capacitive grounding path.

2. The phase shifter of claim 1 wherein the reconfiguring circuit assembly includes a first switch between the first and second inductances, and a second switch between the second inductance and the second node.

3. The phase shifter of claim 2 wherein the reconfiguring circuit assembly further includes a switchable bypass path assembly having third and fourth switches implemented in series between the first and second nodes, and a connection from a node between the third and fourth switches and a node between the first inductance and the first switch.

4. The phase shifter of claim 3 wherein the reconfiguring circuit assembly is configured with each of the first and second switches open, and each of the third and fourth switches closed, to yield a bypass mode in which a phase shift of approximately 0° is achieved between the first and second nodes.

5. The phase shifter of claim 3 wherein the capacitive grounding paths associated with the first inductance includes a capacitance with a value of C implemented at the node between the first inductance and the first switch, and a first switchable capacitive grounding path having a capacitance with a value of 2C, a fifth switch, and a capacitance with a value of 2C, arranged in series between the first node and ground.

6. The phase shifter of claim 5 wherein the reconfiguring circuit assembly is configured with each of the first, second and third switches open, and each of the fourth and fifth switches closed, to yield a shift mode in which a phase shift of approximately −90° is achieved between the first and second nodes.

7. The phase shifter of claim 5 wherein the capacitive grounding paths associated with the second inductance includes a capacitance with a value of C implemented at the node between the second inductance and the first switch, and a second switchable capacitive grounding path having a capacitance with a value of 2C, a sixth switch, and a capacitance with a value of 2C, arranged in series from a node between the second inductance and the second switch to ground.

8. The phase shifter of claim 7 wherein the reconfiguring circuit assembly is configured with each of the third and fourth switches open, and each of the first, second, fifth and sixth switches closed, to yield a shift mode in which a phase shift of approximately −180° is achieved between the first and second nodes.

9. The phase shifter of claim 7 wherein the reconfiguring circuit assembly further includes a seventh switch implemented between ground and a node between the first switch and the second inductance, and a switchable path, having an eighth switch and a capacitance with a value of 2C in series, implemented from the node between the second inductance and the second switch to a node between the fifth switch and the 2C-capacitance closer to the first node.

10. The phase shifter of claim 9 wherein the reconfiguring circuit assembly is configured with each of the third, fourth, fifth and sixth switches open, and each of the first, second, seventh and eighth switches closed, to yield a shift mode in which a phase shift of approximately +90° is achieved between the first and second nodes.

11. The phase shifter of claim 1 wherein the first node is an input node, and the second node is an output node.

12. The phase shifter of claim 11 further comprising a fine phase shifter circuit coupled to the output node, the fine phase shifter circuit including a first transmission line element having an inductance and a variable capacitance on each side of the inductance, such that the fine phase shifter circuit provides a phase shift in an increment having a magnitude that is less than the smallest magnitude of the non-zero quadrant shifts.

13. The phase shifter of claim 12 wherein the fine phase shifter circuit further includes a second transmission line element in series with the first transmission line element, the second transmission line element including an inductance and a variable capacitance on each side of the inductance.

14. An electronic module comprising:
   a packaging substrate configured to receive one or more components; and
   a die mounted on the packaging substrate, the die including a phase shifting circuit having a first node and a second node, and a first switchable path having a first inductance and a second inductance arranged in series between the first and second nodes, the phase shifting circuit further including a capacitive grounding path implemented on each side of each of the first and second inductances, at least one of the capacitive grounding paths configured as a switchable capacitive grounding path, the phase shifting circuit further including a reconfiguring circuit assembly configured to allow the phase shifting circuit to provide a plurality of quadrant phase shifts utilizing the first and second inductances and the at least one switchable capacitive grounding path.

15. The electronic module of claim 14 further comprising a fine phase shifter circuit coupled to the output node, the fine phase shifter circuit including a first transmission line element having an inductance and a variable capacitance on each side of the inductance, such that the fine phase shifter circuit provides a phase shift in an increment having a magnitude that is less than the smallest magnitude of the non-zero quadrant shifts.

16. The electronic module of claim 15 wherein the fine phase shifter circuit is implemented substantially on the same die as the phase shifting circuit.

17. A wireless device comprising:
   a processor configured facilitate processing of a signal; and a phase shifting circuit configured to provide a phase shift for the signal, the phase shifting circuit including a first node and a second node, and a first switchable path having a first inductance and a second inductance arranged in series between the first and second nodes, the phase shifting circuit further including a capacitive grounding path implemented on each side of each of the first and second inductances, at least one of the capacitive grounding paths configured as a switchable capacitive grounding path, the phase shifting circuit further including a reconfiguring circuit assembly configured to allow the phase shifting circuit to provide a plurality of quadrant phase shifts utilizing the first and second inductances and the at least one switchable capacitive grounding path.

18. The phase shifter of claim 1 further configured to provide a bypass state, a single first-handed quarter-wave state, a double first-handed quarter-wave state, or a single second-handed quarter-wave state utilizing two or less inductors.

19. The electronic module of claim 14 wherein the phase shifting circuit is further configured to provide a bypass state, a single first-handed quarter-wave state, a double first-handed quarter-wave state, or a single second-handed quarter-wave state utilizing two or less inductors.

20. The wireless device of claim 17 wherein the phase shifting circuit is further configured to provide a bypass state, a single first-handed quarter-wave state, a double first-handed quarter-wave state, or a single second-handed quarter-wave state utilizing two or less inductors.

* * * * *